United States Patent
Xiao et al.

(10) Patent No.: US 8,907,212 B2
(45) Date of Patent: Dec. 9, 2014

(54) JUNCTION BOX WITH IMPROVED HEAT DISSIPATION

(75) Inventors: Xue-Yuan Xiao, Kunshan (CN); Hong-Qiang Han, Kunshan (CN); Zi-Qiang Zhu, Kunshan (CN)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 213 days.

(21) Appl. No.: 13/542,642

(22) Filed: Jul. 5, 2012

(65) Prior Publication Data

US 2013/0012058 A1 Jan. 10, 2013

(30) Foreign Application Priority Data

Jul. 5, 2011 (CN) .................. 2011 2 0233606 U
Jul. 5, 2011 (CN) .................. 2011 2 0234512 U

(51) Int. Cl.
*H02G 3/08* (2006.01)
*H05K 7/20* (2006.01)
*H01L 31/048* (2014.01)

(52) U.S. Cl.
CPC ............ *H01L 31/0486* (2013.01); *Y02E 10/50* (2013.01)
USPC ......... 174/50; 174/520; 174/17 VA; 361/600; 361/676; 361/688; 439/535

(58) Field of Classification Search
USPC .......... 174/50, 559, 17 R, 17 VA, 520, 50.52, 174/547, 59; 361/600, 601, 676, 677, 678, 361/679.01, 688, 690, 724, 752, 679.46, 361/679.02, 692; 439/76.1, 76.2, 535, 485
See application file for complete search history.

(56) References Cited

U.S. PATENT DOCUMENTS

| | | | |
|---|---|---|---|
| 7,134,883 B2 * | 11/2006 | Werner et al. ................... | 174/50 |
| 7,291,036 B1 * | 11/2007 | Daily et al. ................... | 439/76.1 |
| 8,097,818 B2 * | 1/2012 | Gerull et al. ................... | 174/59 |
| 8,113,853 B2 * | 2/2012 | Coyle et al. ................... | 439/76.1 |
| 8,248,804 B2 * | 8/2012 | Han et al. ....................... | 174/50 |
| 8,471,145 B2 * | 6/2013 | Suzuki ........................... | 174/50 |
| 8,519,278 B2 * | 8/2013 | Lenel ............................ | 361/692 |
| 2013/0043055 A1 * | 2/2013 | Ma et al. ....................... | 174/520 |

FOREIGN PATENT DOCUMENTS

EP 2279529 2/2011

* cited by examiner

*Primary Examiner* — Angel R Estrada
(74) *Attorney, Agent, or Firm* — Wei Te Chung; Ming Chieh Chang

(57) ABSTRACT

A junction box includes a cable connecting box and a cover covering the cable connecting box. The cable connecting box includes an insulative block, a plurality of contacting foils retained in the insulative block and a plurality of diodes. Each diode connects with two neighborly contacting foils. The contacting foils are insert-molded with the insulative block. Based on thermal radiation properties of the plastic material is superior to that of the metal material, as the contacting foils transfer the heat to the insulative block, the insulative block would deliver the heat to the cable connecting box, then the heat would be delivered to the cover. Such that, the heat dissipates outside quickly from the junction box.

17 Claims, 8 Drawing Sheets

JUNCTION BOX WITH IMPROVED HEAT DISSIPATION

BACKGROUND OF THE INVENTION

1. Field of the Invention

The present invention generally relates to a junction box, and more particularly to a junction box with good heat dissipation.

2. Description of Related Art

EP patent publication NO. 2279529 published on Feb. 2, 2011 discloses a PV junction box including an insulative box, a cover covering the insulative box, a plurality of connecting foils and a plurality of diodes connecting with two neighborly connecting foils. The insulative box includes a bottom wall, a front wall, a rear wall and two side walls extending upwardly from the bottom wall and a cavity defined by these walls. Two through holes are defined in the front wall for cables passing therethrough. The connecting foils comprise a plurality of body portions retained in the bottom wall. The bottom face of the body portion is hidden under the bottom wall and the top face is exposed in the cavity. However, when the PV (photovoltaic) junction box is retained in the PV module, the junction box is presented as an airproof box, the diodes generate heat and transmit the heat to the air of the cavity by the contacting foils. Then the heat dissipates outside by the cover after the air transmitting the heat to the cover. In view of the poor thermal radiation properties of metal materials, heat generated by the contacting foils will not dissipate timely, which may destroy the junction box easily.

Hence, an improved junction box is desired to overcome the above problems.

SUMMARY OF THE INVENTION

An objector of the invention is to provide a junction box with improved heat dissipation.

According to one aspect of the present invention, a junction box comprises an insulative block, a plurality of metal contacting foils retained in the insulative block and a plurality of diodes connecting with two neighborly contacting foils. A cover covers the cable connecting box. A plurality of cables electrically connect with the cable connecting box. The contacting foils are insert-molded in the insulative block, the insulative block defines a plurality of hollows to reserve deformation spaces to prevent a separation between the insulative block and the contacting foils after thermal expansion.

Other objects, advantages and novel features of the present invention will become more apparent from the following detailed description of the present embodiment when taken in conjunction with the accompanying drawings.

DETAILED DESCRIPTION OF THE INVENTION

Figure 1:
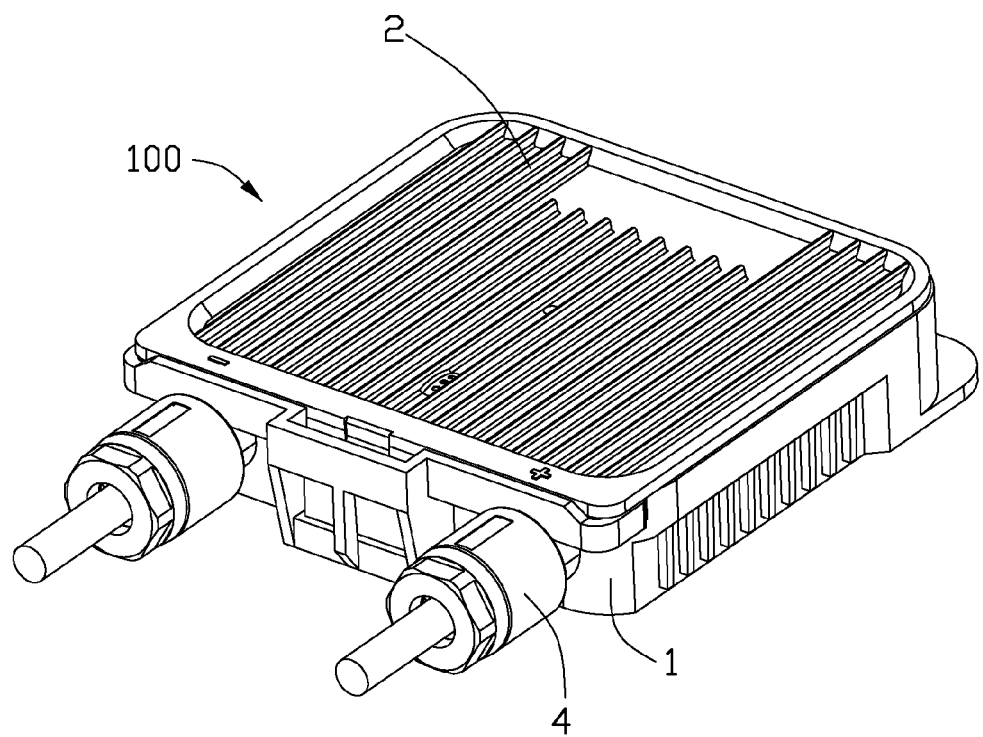
FIG. 1 is an assembled perspective view of a junction box according to a preferred embodiment of the present invention.
Figure 2:
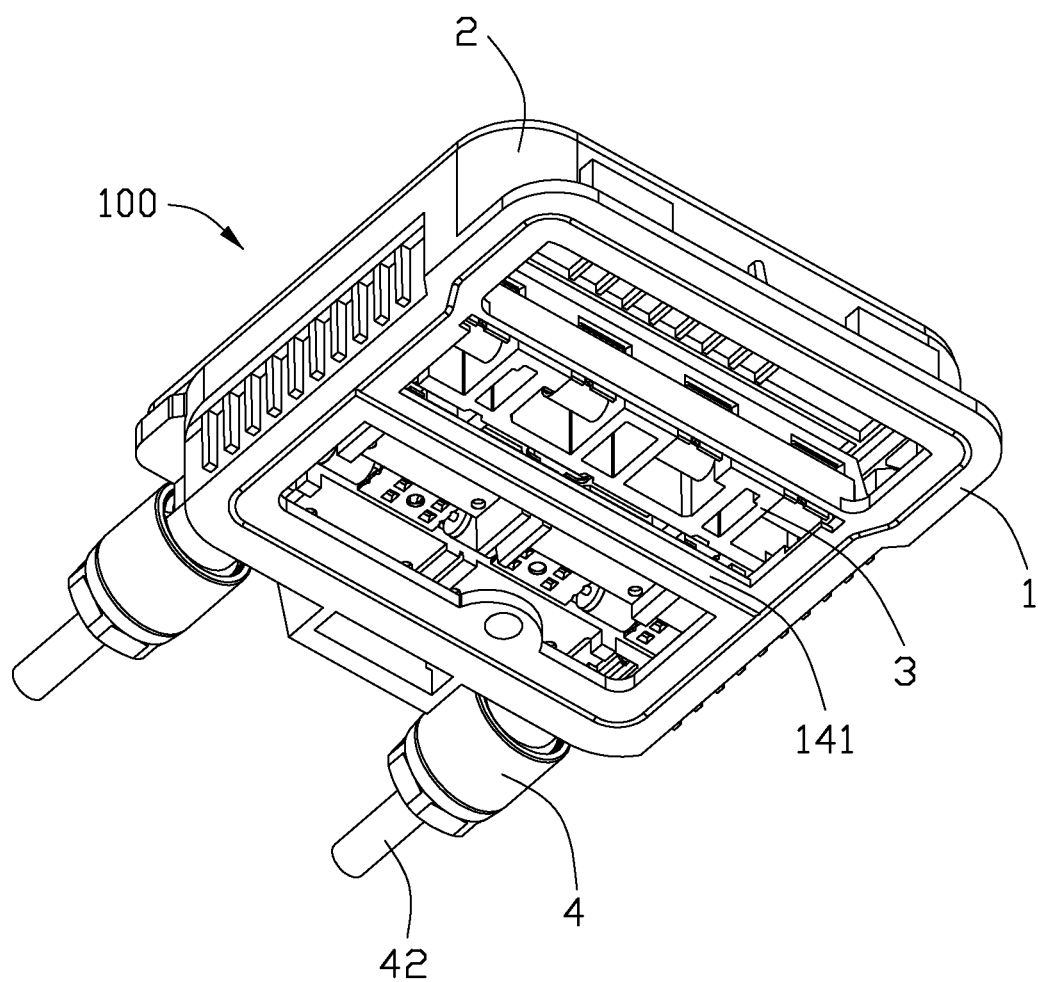
FIG. 2 is another assembled perspective view of the junction box according to the present invention, but taken from another view.

Reference will now be made to the drawing figures to describe the preferred embodiment of the present invention in detail.

Referring to FIGS. 1-8, a junction box 100 used for electrically connecting a photovoltaic (PV) module (not labeled) and transmitting electrical current according to the present invention is disclosed. The junction box 100 includes a cable connecting box, a cover 2 covering an upper side of the cable connecting box and a cable 4 connecting with the cable connecting box. The cable connecting box includes an insulative box 1 and a wire connecting module 3 attached to the insulative box 1.

Figure 3:
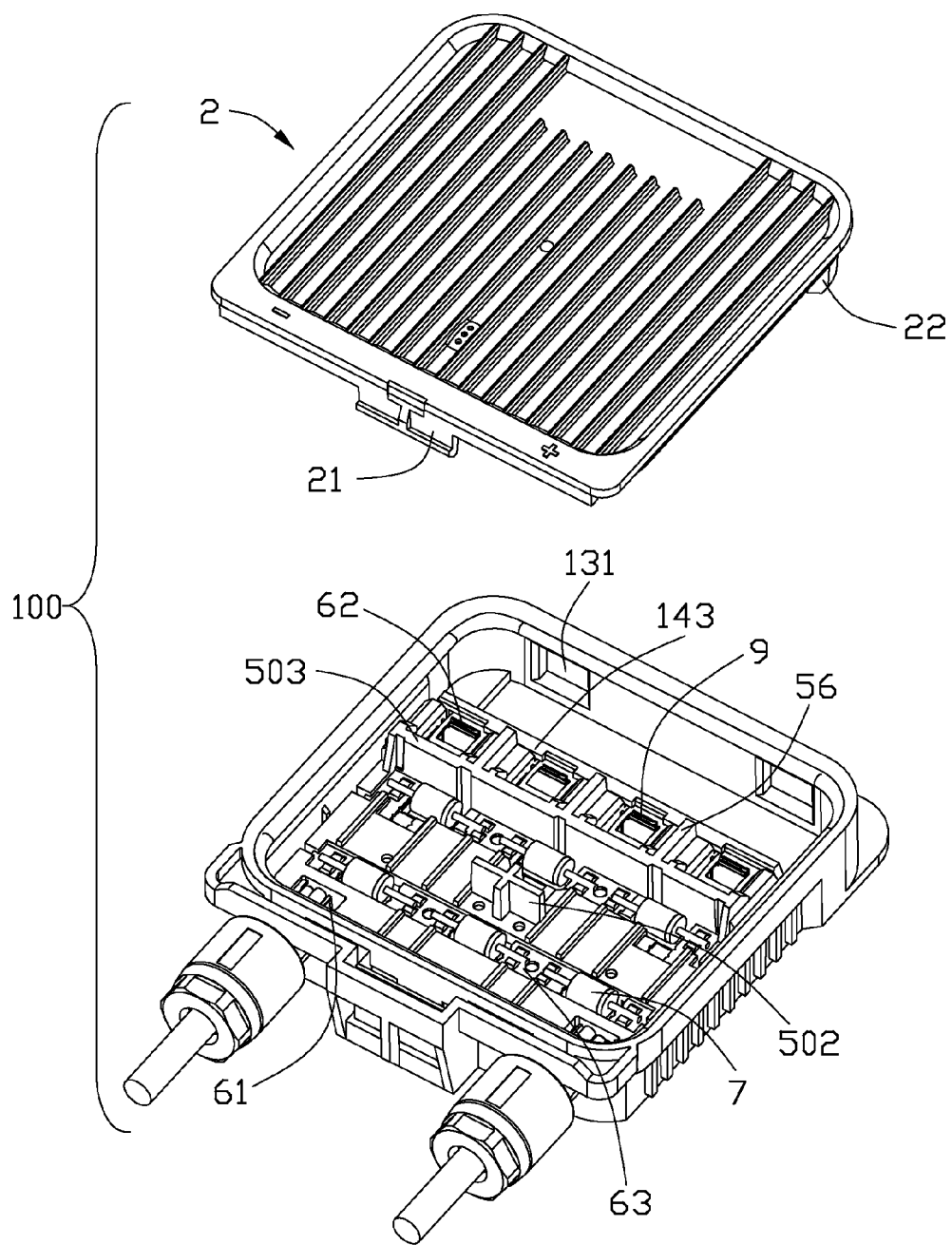
FIG. 3 a perspective view of the junction box with a cover separated from a cable connecting box.
Figure 4:
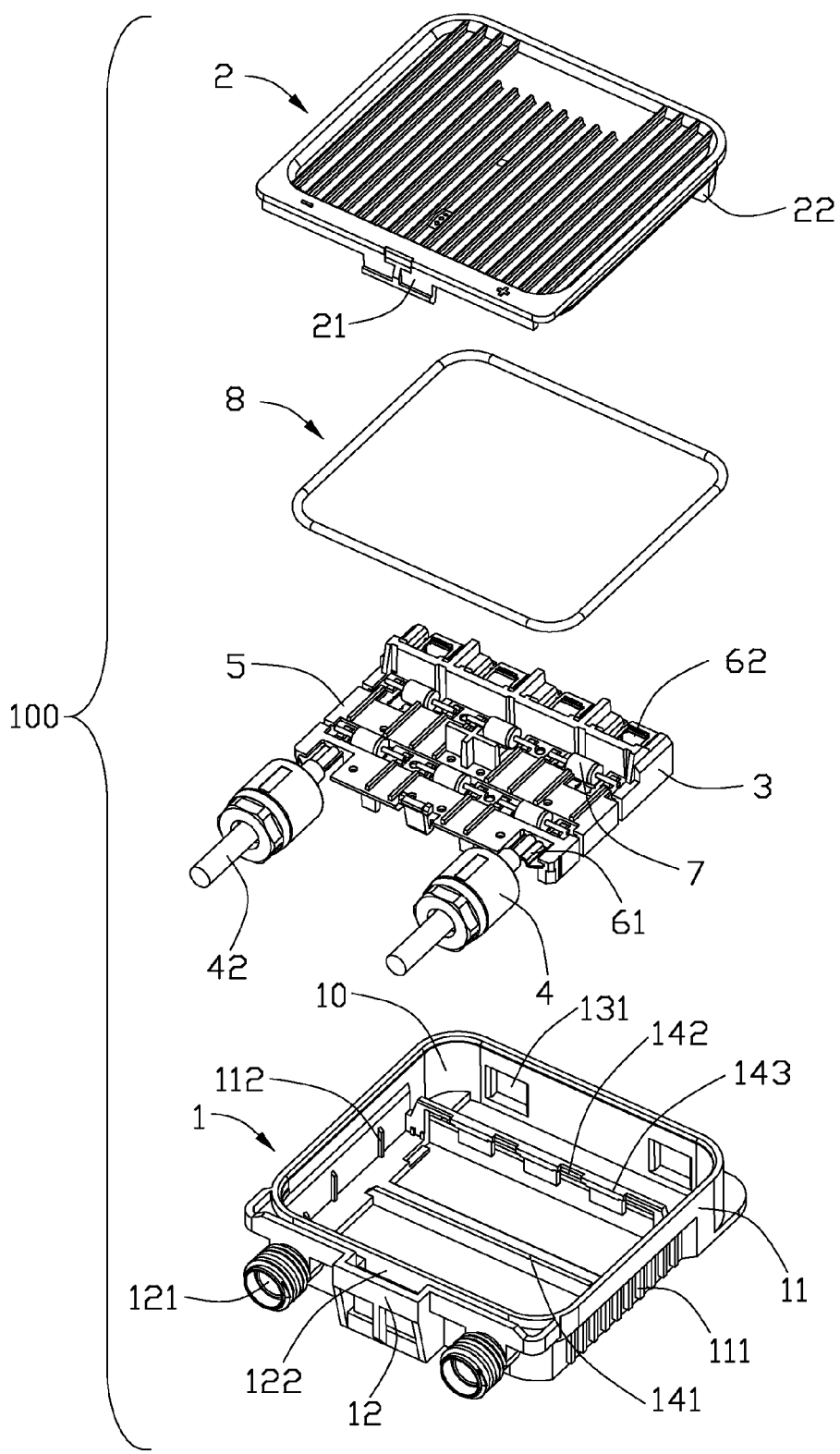
FIG. 4 is a partly exploded perspective view of the junction box shown in FIG. 1.
Figure 5:
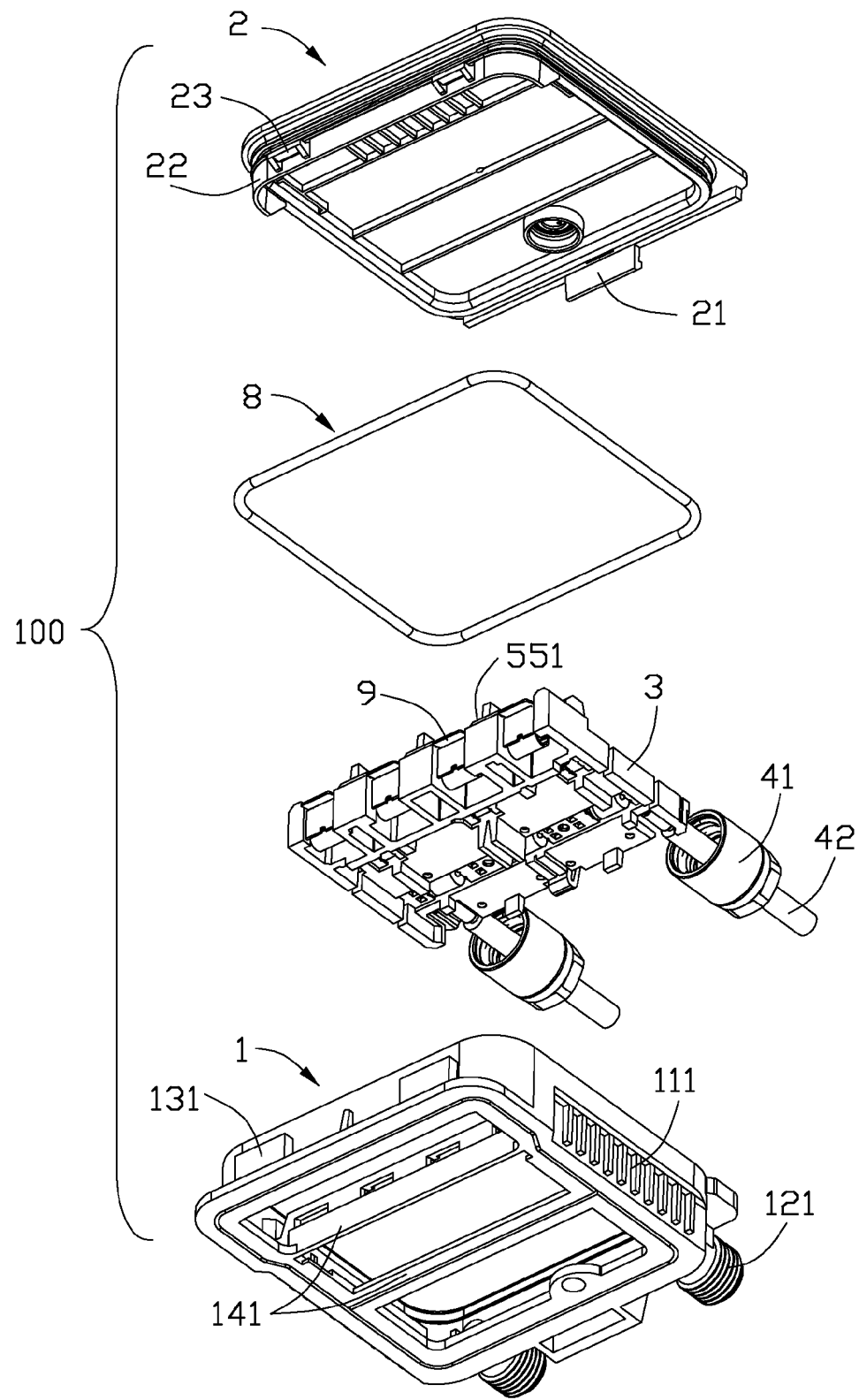
FIG. 5 is similar with FIG. 4, but taken from another view.
Figure 6:
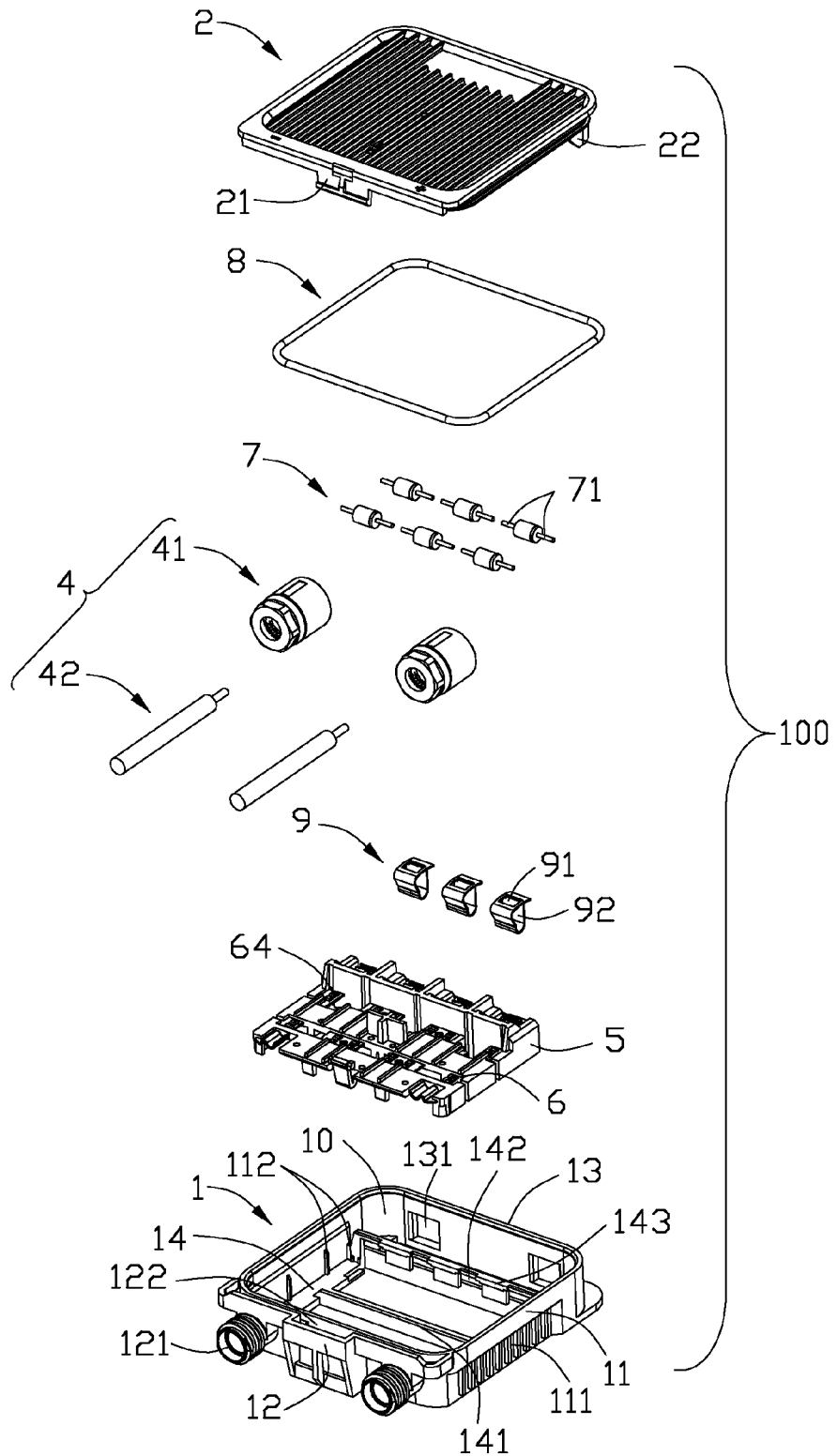
FIG. 6 is an exploded perspective view of the junction box.
Figure 7:
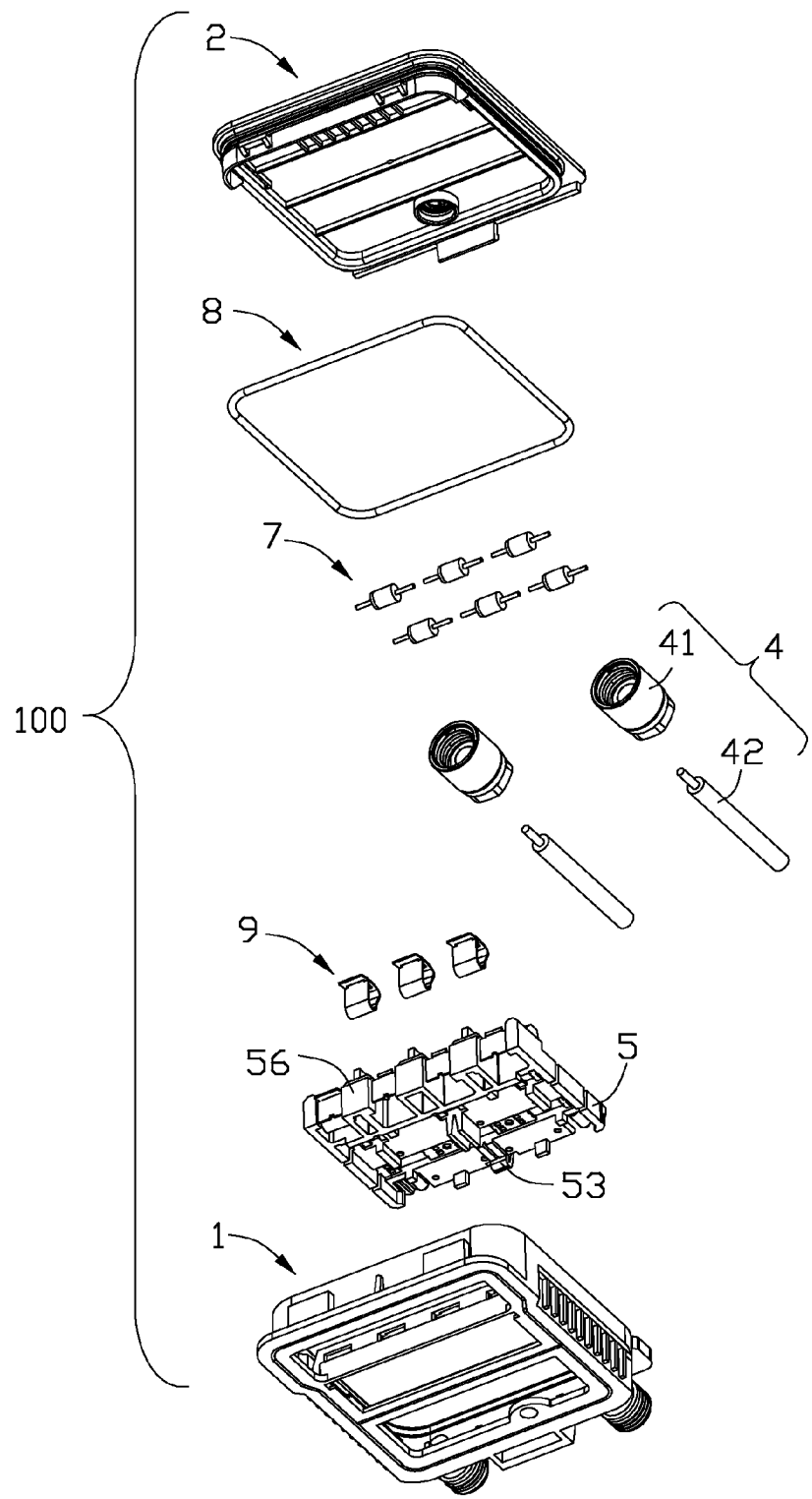
FIG. 7 is similar with FIG. 6, while taken from a different aspect.
Figure 8:
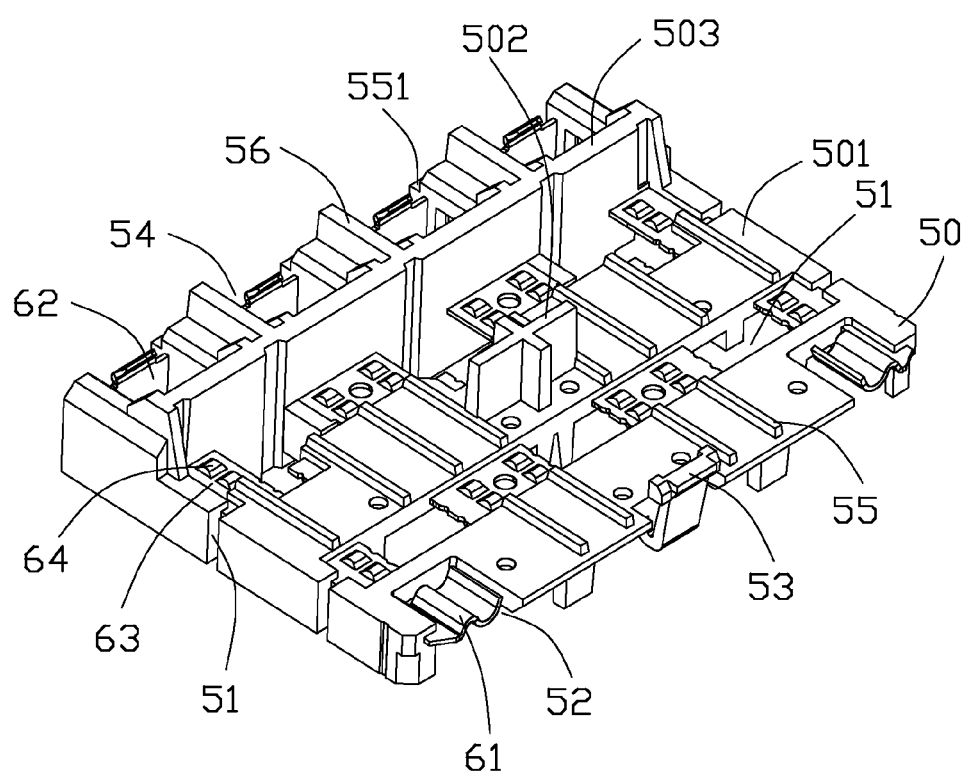
FIG. 8 is a perspective view of a wire connecting module of the junction box.

Please referring to FIGS. 3-4, the wire connecting module 3 includes a plastic insulative block 5 presented as a rectangular shape, a plurality of contacting foils 6 and a plurality of diodes 7 connecting with two neighborly contacting foils 6.

Please referring to FIGS. 4-8, the insulative block 5 has a body portion 50 approximately shaped as a rectangular plate, a plurality of hollows 51 extending through the body portion 50 along an up-to-down direction. The body portion 50 has a top face 501 facing the cover 2 and a plurality of ribs 55 protruding upwardly from the top face 501.

In present invention, the insulative block 5 has two such hollows 51 arranged along a front-to-back direction. The insulative block 5 is divided into three portions along the front-to-back direction by the hollows 51 which extend along a transverse direction vertical to the front-to-back direction of the body portion 50. The first portion of the body portion 50 is formed with a pair of first escaping portions 52 at two sides of a front end thereof and a hook 53 at a middle of the front end thereof. The first escaping portions 52 extend through the body portion 50 along the up-to-down direction. The hook 53 extends forwardly and upwardly from the middle of the body portion 50.

The second portion of the body portion 50 includes a supporting portion 502 extending upwardly from the top surface 501 to support the cover 2. The third portion of the body portion 50 has a fence 503 extending along the transverse direction and located at a rear of the second portion, and a plurality of second escaping portions 54 recessed forwardly from a rear edge thereof. Each two adjacent second escaping portions 54 has a separating wall 56 therebetween. The separating wall 56 defines a plurality of depressions 551 at a top of a rear end of the separating plate 56. The ribs 55 extend along the front-to-back direction and are distributed uniformitily on the top face 501 to enlarge an area for heat dissipation. The ribs 55 are parallel to each other.

The contacting foils 6 have a plurality of connecting portions 61 connecting with the cable 4 and received in the first escaping portions 52, a plurality of base portions insert-molded with the body portions 50 and extending backwardly along a mating direction of the cable 4, and a plurality of contacting portions 62 extending backwardly from the base portion and connecting with the photovoltaic module. The base portions further have a plurality of soldering portions 63 exposed in the hollows 51. The soldering portions 63 have a plurality of embosses 64 protruding upwardly, each soldering portion 63 has a pair of embosses 64.

The junction box 100 further has a plurality of clamp springs 9 for clamping the contacting portions 62 of the contacting foils 6 and a plurality of contacting plates (not shown) of the photovoltaic module. One end of the clamp spring 9 defines a through hole 91, the other end of the clamp spring 9 has a tab 92 with a width of the tab 92 smaller than that of a body of the clamp spring 9. The tab 92 extends through the through hole 91, and the contacting portion 62 is clamped between the tab 92 and an inner wall of the through hole 91. Insert the contacting plate of the photovoltaic module into an area between the tab 92 and the inner wall of the through hole 91 and be clamped by the tab 92 and the inner wall of the through hole 91 to electrically connect the junction box 100 with the photovoltaic module.

Each of the diodes 7 has a pair of tails 71 extending outwardly from two sides thereof, each tail 71 is soldered between two adjacent embosses 64 of the soldering portions 63. The insulative box 1 presents as a rectangular box, including two side walls 11, a front wall 12 and a rear wall 13 connecting the two side walls 11, a receiving cavity 10 surrounding by the side walls 11, the front wall 12 and the rear wall 13. The insulative box further comprises a bottom wall 14 located under the receiving cavity 10. The front wall 12 defines two side by side mounting holes 121 with exterior thread, from which the cables extend through to connect with the connecting portions 61. A locking slot 122 is defines between the two mounting holes 121 and a depressing slot (not labeled) is recessed from a surface facing to the receiving cavity 10 for locking with the hook 53 of the insulative block 5. The two side walls 11 have a plurality of ribs 111 extending along the up-to-down direction on an outside of the side walls 11 to enlarge an area for heat dissipation. A plurality of position blocks 112 extend inwardly along the up-to-down direction on an inside of the side walls 11 to engage with the insulative block 5.

The rear wall 13 defines two locking holes 131 extending through thereof along a front-to-back direction. The bottom wall 14 has a plurality of windows (not labeled) and two bridges 141 extending along a transverse direction between the windows and being parallel to each other. One of the bridge 141 closed to the rear wall 13 defines a plurality of openings 142 extending therethrough along a front-to-back direction and arranged side by side, the bridge 141 further has an pressing portion 143 located between two neighborly openings 142 to engage with the depression 551. A wire mating portion (not labeled) is formed between the bridge 141 near to the rear wall 13 and the rear wall 13 for the contacting plates of the photovoltaic module inserting into. Two sides of the pressing portion 143 extend outwardly till the opening 142 to abut against a free end of the clamp spring 9 with the through hole 91 to prevent the clamp spring 9 from loosing.

The cover 2 comprises a locking barb 21 locking with the locking slot 122 of the front wall 12 of the insulative box 1. A preventing blade 22 extends downwardly from a back end of the cover 2. The preventing blade 22 has a plurality of protrusions 23 extending backwardly to lock with the locking holes 131 of the rear wall 13. An o-ring 8 seals the insulative box 1 when the cover 2 covers the insulative box 1, to prevent water flowing into an inner side of the junction box 100. The o-ring 8 is made of silicone or plastics materials and is formed in a rectangular circuit configuration.

The two cables 4 include two nuts 41 with interior thread and two wires 42 extending through the nuts 41 along a front-to-back direction. The interior threads of the nuts 41 match to the exterior threads of the mounting holes 121. The wires 42 insert into the insulative box 1 through the mounting holes 121 and electrically connect with the connecting portions 61 of the contacting foils 6 through the mounting holes 121, to finally position the cables 4 to the insulative box 1.

As fully described above, based on thermal radiation properties of the plastic material is superior to that of the metal material, the contacting foils 6 are insert-molded with the insulative block 5, so a joint between the contacting foils 6 and the insulative block is tightly and reliably, and the contacting foils 6 efficiently transfer the heat to the insulative block 5, the insulative block 5 efficiently radiates the heat to the inner air of the insulative box 1 and the bottom wall 14 of and the insulative box 1, then the heat can be delivered to the cover 5 by the air and the whole insulative box 1. Such that, the heat would be dissipated outside quickly from the junction box 100. The hollows 51 of the insulative block 5 provide deformation spaces to prevent a separation between the insulative block 5 and the contacting foils 6 after thermal expansion.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A junction box, comprising:
an cable connecting box including a plastic insulative block, a plurality of metal contacting foils retained in the insulative block and a plurality of diodes connecting with two neighborly contacting foils;
a cover covering the cable connecting box; and
a plurality of cables electrically connecting with the cable connecting box; wherein
the contacting foils are insert-molded in the insulative block, the insulative block defines a plurality of hollows divided the insulative block into several independent portions along a front-to-back direction and the independent portions being unified by the contacting foils each extending along the front-to-back direction to reserve deformation spaces to prevent a separation between the insulative block and the contacting foils after thermal expansion.

2. The junction box as claimed in claim 1, wherein the hollows extend through the insulative block along an up-to-down direction respectively and paralleled to each other along the front-to-back direction.

3. The junction box as claimed in claim 1, wherein the hollows are recessed along a direction perpendicular to the mating direction of the cables and paralleled to each other along the mating direction.

4. The junction box as claimed in claim 3, wherein the contacting foils comprise a plurality of connecting portions, a plurality of base portions extending from the connecting portions and insert molded in the insulative block.

5. The junction box as claimed in claim 4, wherein the base portions comprise a plurality of soldering portions exposed in the hollows, the diodes are soldered with the soldering portions and partly received in the hollows along the up-to-down direction.

6. The junction box as claimed in claim 5, wherein the contacting foils further comprise a plurality of contacting portions to connect with the photovoltaic module, the contacting portions extend from free ends of the base portions.

7. The junction box as claimed in claim 4, wherein the cable connecting box further comprises an insulative box, the insulative box defines a receiving cavity and a bottom wall located under the receiving cavity.

8. The junction box as claimed in claim 7, wherein the insulative box comprises four side walls extending upwardly from the bottom wall and surrounding around the receiving cavity, the four walls including a front wall near to the connecting portions, a rear wall neighboring to the contacting portions and two side walls connecting with the front wall and the rear wall, a plurality of positioning blocks are arranged in the side walls to position the insulative block in the receiving cavity.

9. The junction box as claimed in claim 8, wherein the front wall defines a plurality of mounting holes, from which the cable extend through to connect with the connecting portions, the bottom wall provides a wire mating portion for the photovoltaic module inserting and connecting with the junction box.

10. The junction box as claimed in claim 9, wherein the insulative block defines a pair of first escaping portions at a front edge thereof to receive the connecting portions of the contacting foils, a hook set forwardly between the two first escaping portions to abut against the front wall.

11. A junction box comprising:
a cable connecting box including an insulative box and an insulative block retained to the insulative box, a plurality of contacting foils retained in the insulative block and a plurality of diodes connecting with two neighborly contacting foils; and
a cover covering the cable connecting box; wherein
the insulative block has a body portion and a plurality of hollows recessed thereof to divide the body portion into a plurality of independent portions along a front-to-back direction while the dependent portions being unified by the contacting foils partly exposed in the hollows along the front-to-back direction, the hollows being used to provide deformation spaces for the body portion.

12. The junction box as claimed in claim 11, wherein each contacting foil comprises a base portion, a connecting portions and a contacting portion connecting with two opposite ends of the base portion respectively, the base portion is insert-molded in the insulative block.

13. The junction box as claimed in claim 12, wherein the connecting portions and the contacting portions extend beyond the insulative block and are exposed into the air within the cable connecting box.

14. The junction box as claimed in claim 12, wherein the insulative box comprises a bottom wall and the insulative block is set over the bottom wall.

15. The junction box as claimed in claim 14, wherein four walls extend upwardly from the bottom wall to form a receiving cavity, a plurality of positioning blocks are set in the inner wall of the cavity to limit the insulative block.

16. A junction box comprising:
a cable connecting box including a plastic insulative block defining a front region and a rear region along a front-to-back direction, said front region independently unitarily formed with a plurality of cavities to receive corresponding clamps therein, and said rear region including more than one pieces which individually extends along a transverse direction perpendicular to said front-to-back direction and spaced from one another in the front-to-back direction while being unified by a plurality of contacting foils each extending along the front-to-back direction and integrally formed with said more than one pieces via an insert molding process under condition that each of said contacting foils further extends to the front region and mechanically and electrically connects to the corresponding clamp; wherein
integration of the contacting foils and the rear region enhances heat dissipation, and said more than one pieces of the rear region provide the rear region with more deformability for tolerating heat expansion.

17. The junction box as claimed in claim 16, wherein every adjacent two contacting foils in the transverse direction are spaced from each other with a space into which a corresponding diode is received under condition that said space provides ventilation effect in a vertical direction perpendicular to both said front-to-back direction and said transverse direction.

* * * * *